United States Patent
Ma

(10) Patent No.: US 11,676,653 B2
(45) Date of Patent: Jun. 13, 2023

(54) READ/WRITE CONTROL METHOD AND DEVICE FOR DDR DYNAMIC RANDOM ACCESS MEMORY, AND SYSTEM

(71) Applicant: BOE Technology Group Co., Ltd., Beijing (CN)

(72) Inventor: Xitong Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 64 days.

(21) Appl. No.: 17/407,092

(22) Filed: Aug. 19, 2021

(65) Prior Publication Data

US 2022/0093163 A1 Mar. 24, 2022

(30) Foreign Application Priority Data

Sep. 23, 2020 (CN) .......................... 202011008745.4

(51) Int. Cl.
*G11C 11/4096* (2006.01)
*G06F 13/24* (2006.01)
*G06F 13/16* (2006.01)

(52) U.S. Cl.
CPC ...... *G11C 11/4096* (2013.01); *G06F 13/1668* (2013.01); *G06F 13/24* (2013.01)

(58) Field of Classification Search
CPC .. G11C 11/4096; G06F 13/1668; G06F 13/24
See application file for complete search history.

(56) References Cited

U.S. PATENT DOCUMENTS

| | | | | |
|---|---|---|---|---|
| 2008/0266305 | A1* | 10/2008 | Cheng | G09G 5/395 345/530 |
| 2012/0082399 | A1* | 4/2012 | Yanada | G06V 10/94 382/294 |
| 2012/0249875 | A1* | 10/2012 | Cheng | G11B 27/034 348/E5.009 |
| 2013/0198432 | A1* | 8/2013 | Ning | G06F 13/4027 710/306 |
| 2014/0184485 | A1* | 7/2014 | Kim | G09G 3/3406 345/102 |
| 2019/0164518 | A1* | 5/2019 | Dimitrov | G09G 5/001 |
| 2020/0312278 | A1* | 10/2020 | Wu | G09G 5/397 |

* cited by examiner

*Primary Examiner* — Eric T Oberly
(74) *Attorney, Agent, or Firm* — IPro, PLLC

(57) ABSTRACT

The disclosure provides a read/write control method and device for a DDR (Double Data Rate) dynamic random access memory, and a system. The device comprises a read control signal generating unit and a read memory controller, and the read control signal generating unit is in signal connection with the read memory controller; the read control signal generating unit is configured for determining a minimum frame period from multiple received signal sources, generating a read control signal based on the minimum frame period, and providing the read control signal to the read memory controller; and the read memory controller is configured for controlling the reading of video frames from the DDR dynamic random access memory according to the read control signal.

14 Claims, 3 Drawing Sheets

READ/WRITE CONTROL METHOD AND DEVICE FOR DDR DYNAMIC RANDOM ACCESS MEMORY, AND SYSTEM

The disclosure claims the priority of a Chinese patent application filed in the China National Intellectual Property Administration on Sep. 23, 2020 with application number 202011008745.4 and application name "Read/Write Control Method and Device for DDR Dynamic Random Access Memory, and System", the entire contents of which are hereby incorporated by reference.

TECHNICAL FIELD

The disclosure relates to the technical field of random access memories, in particular to a read/write control method and device for a DDR (Double Data Rate) dynamic random access memory, and a system.

BACKGROUND

With the development of video surveillance, it may be necessary to at the same time monitor multiple targets in one occasion, that is, multiple input signals from different sources with the same frame rate. When processing multiple input signals from different sources with the same frame rate, the frame frequency of a first signal source on an output side can be used to match the frame frequencies of other signal sources, that is, other signal sources follow the frame frequency of the first signal.

SUMMARY

The disclosure provides a read/write control method and device for a DDR dynamic random access memory, and a system.

In a first aspect, an embodiment of the disclosure provides a read/write control device for a DDR dynamic random access memory, the device comprises a read control signal generating unit and a read memory controller, and the read control signal generating unit is in signal connection with the read memory controller;

the read control signal generating unit is configured for determining a minimum frame period from multiple received signal sources, and also configured for generating a read control signal based on the minimum frame period and providing the read control signal to the read memory controller; and the read memory controller is configured for controlling the reading of video frames from the DDR dynamic random access memory according to the read control signal.

In a second aspect, an embodiment of the disclosure provides a read/write control method for a DDR dynamic random access memory, the method is applied to the read/write control device for the DDR dynamic random access memory, and the method comprises:

determining a minimum frame period from multiple received signal sources;

generating a read control signal based on the minimum frame period; and controlling the reading of video frames from the DDR dynamic random access memory according to the read control signal.

In a third aspect, an embodiment of the disclosure provides a monitor system, and the system comprises the read/write control device for the DDR dynamic random access memory as described in the first aspect.

The above description is only an overview of the technical solution of this disclosure, which can be implemented according to the contents of the specification in order to understand the technical means of this disclosure more clearly, and in order to make the above and other objects, features and advantages of this disclosure more obvious and understandable, the detailed description of this disclosure will be given below.

BRIEF DESCRIPTION OF THE DRAWINGS

Other features, objects and advantages of the disclosure will become more apparent by reading the detailed description of non-limiting embodiments made with reference to the following drawings.

DETAILED DESCRIPTION

Figure 1:
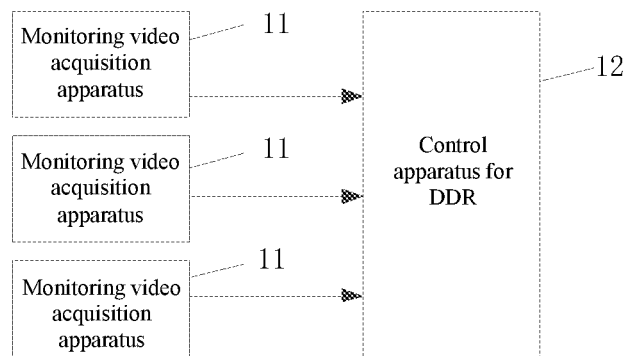
FIG. 1 shows a structural diagram of a monitor system provided by an embodiment of the disclosure.

The disclosure will be further described in detail with reference to the drawings and embodiments. It can be understood that the specific embodiments described here are only used to explain the relevant disclosure, but not to limit the disclosure. It should also be noted that for convenience of description, only the parts related to disclosure are shown in the drawings.

It should be noted that the embodiments in the disclosure and the features in the embodiments can be combined without conflict. Hereinafter, the disclosure will be described in detail with reference to the drawings and in combination with embodiments.

Please refer to FIG. 1, FIG. 1 shows a structural diagram of a monitor system provided by an embodiment of the disclosure. As shown in FIG. 1, the monitor system comprises a plurality of monitoring video acquisition apparatuses 11 and a DDR dynamic random access memory control apparatus 12.

The monitoring video acquisition apparatuses 11 are configured for acquiring monitoring video data and transmitting the acquired monitoring video data to the DDR dynamic random access memory control apparatus 12 through a corresponding data transmission channel.

Each monitoring video acquisition apparatus can be regarded as a signal source, for example, it can be represented by SDI-number. For example, SDI-1 represents a first signal source and SDI-2 represents a second signal source.

The DDR dynamic random access memory control apparatus 12 is configured for performing real-time superimposing on the received monitoring video data to obtain an output display image.

In the related art, when multiple video data (monitoring video data corresponding to multiple signal sources) are written into the DDR dynamic random access memory (DDR for short), the writing is usually controlled based on a first signal in the frequency of multiple received videos, and other signals follow the first signal. However, the monitoring video frame data are read from the DDR according to the frame frequency corresponding to the written monitoring video frame data. For example, the frame rate of the first signal at t1 is 59.9 Hz, and if the frame frequency of the first signal is followed, the frame frequency of other signals is also 59.9 Hz. If the frame frequency of the first signal at t2 becomes 60.0 Hz due to temperature or time jitter, in theory, the frame frequency of other signals which follow the frame rate of the first signal will also be adjusted to 60.0 Hz. However, in the transmission process of other signals, clock jitter or temperature might cause a change in the frame rate. For example, when following the frame frequency of the first signal 59.9 Hz at t1, the second signal actually has a frame frequency of 60.0 Hz, but the DDR control apparatus still conducts control according to the frame frequency of the first signal, and as a result, there will be a difference of one frame between the second signal and the first signal at t1+10 s, that is, the second signal will lose one frame. The above loss is intolerable for the monitor system.

In order to solve the above problem, the disclosure provides a technical solution for read/write control of a DDR, which can effectively solve the problem of frame loss when reading videos from the DDR.

Figure 2:
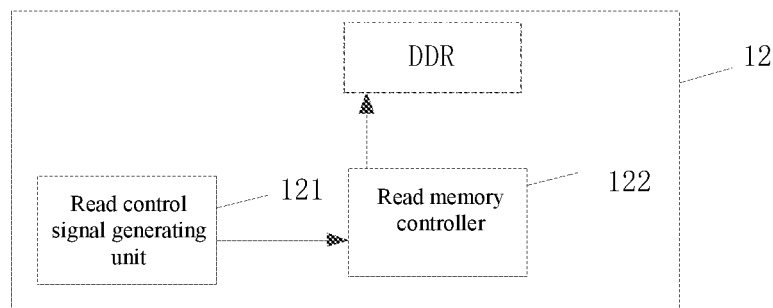
FIG. 2 shows a structural diagram of a read/write control device for a DDR dynamic random access memory provided by an embodiment of the disclosure.

The working principle of read-write control of the DDR proposed in this disclosure will be described with reference to FIG. 2. Please refer to FIG. 2, which shows a structural diagram of a read/write control device for a DDR provided by an embodiment of the disclosure. As shown in FIG. 2, the device comprises a read control signal generating unit 121 and a read memory controller 122, and the read control signal generating unit 121 is in signal connection with the read memory controller 122;

the read control signal generating unit 121 is configured for determining a minimum frame period from multiple received signal sources, and also configured for generating a read control signal based on the minimum frame period and providing the read control signal to the read memory controller; and the read memory controller 122 is configured for controlling the reading of video frames from the DDR dynamic random access memory according to the read control signal.

According to the embodiment of the disclosure, by determining the minimum frame period corresponding to the multiple signal sources, then generating the read control signal based on the minimum frame period, and using the generated read control signal to control the reading of the video frames from the DDR, the problem of frame loss caused by fixedly following the first signal source can be effectively solved.

Figure 3:
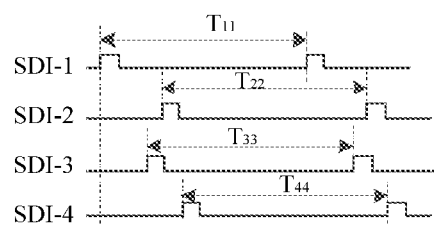
FIG. 3 shows a schematic diagram of a frame period provided by an embodiment of the disclosure.

The minimum frame period refers to a minimum value of frame period determined from the multiple signal sources. The frame period refers to a time interval between two adjacent vertical synchronization signals in each signal source. The vertical synchronization signal, which can also be called vertical synchronization (Vsync), refers to a pulse signal between two frames, which is used to indicate the end of a previous frame and the start of a new frame. Vsync may be a pulse lasting pretty long, which may last for one or several lines of scanning time, but no pixel signal appears during this period. As shown in FIG. 3, a waveform graph of acquired pulse signals corresponding to each signal source is drawn by taking four monitoring signals as an example, where T11 represents the frame period of a first signal source SDI-1, T22 represents the frame period of a second signal source SDI-2, T33 represents the frame period of a third signal source SDI-3, T44 represents the frame period of a fourth signal source SDI-4. One of T11, T22, T33 and T44 is determined as the minimum frame period.

After determining the minimum frame period among the plurality of frame periods, the read control signal generating unit 121 generates a read control signal based on the minimum frame period, and the read memory controller 122 controls operation based on the read control signal.

Figure 4:
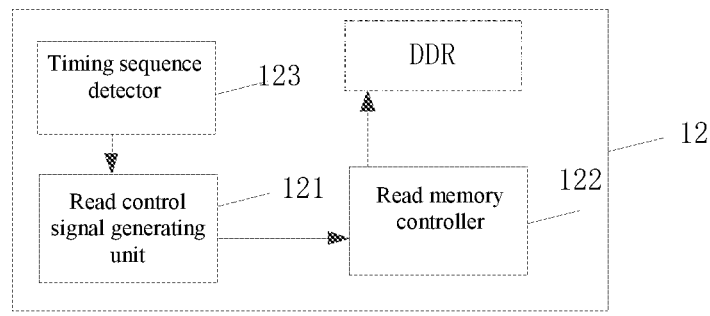
FIG. 4 shows a structural diagram of a read/write device for a DDR dynamic random access memory provided by an embodiment of the disclosure.

Next, with reference to FIG. 4, the principle of determining the minimum frame period and a frame period difference by the read/write device for the DDR will be further described.

As shown in FIG. 4, the device may further comprise a timing sequence detector 123. The timing sequence detector 123 is in signal connection with the read control signal generating unit 121, and is also in signal connection with a write memory controller.

The timing sequence detector 123 is configured for determining a frame period corresponding to each signal source based on a time interval between two adjacent vertical synchronization signals of each signal source in the multiple signal sources.

The timing sequence detector 123 is also configured for:
  determining a vertical synchronization signal corresponding to the first signal source in the multiple signal sources;
  determining vertical synchronization signals corresponding to other signal sources in the multiple signal sources; and
  determining the frame period difference based on the vertical synchronization signal corresponding to the first signal source and the vertical synchronization signals corresponding to the other signal sources.

The frame period difference refers to the difference between the frame periods corresponding to other signal sources and the frame period corresponding to the first signal source in the multiple signal sources. The first signal source can be determined according to interface positions corresponding to the multiple signal sources, for example, an interface address corresponding to SDI-1 is an interface address of SDI_RX1. This interface address can be considered as the first signal source.

According to the embodiment of the disclosure, by adding the statistical analysis function for the frame period in the timing sequence detector, and using a statistical analysis result to generate the read control signal, the multiplexing efficiency of components is effectively improved.

Figure 5:
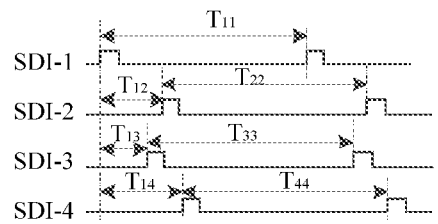
FIG. 5 shows a schematic diagram of a frame period difference provided by an embodiment of the disclosure.

FIG. 5 is a schematic diagram of a frame period difference between other signal sources and the first signal source determined based on the four acquired monitoring signals shown in FIG. 3. As shown in FIG. 5, T12 represents a time difference between the frame period of the first signal source SDI-1 and the frame period of the second signal source SDI-2. T13 represents a time difference between the frame period of the first signal source SDI-1 and the frame period of the third signal source SDI-3. T14 represents a time difference between the frame period of the first signal source SDI-1 and the frame period of the fourth signal source SDI-4.

After determining the minimum frame period, the read control signal generating unit 122 is configured for determining the frame period difference corresponding to the minimum frame period, determining a rising edge of each vertical synchronization signal of the signal source corresponding to the minimum frame period, and delaying each rising edge by the frame period difference corresponding to the minimum frame period to obtain a rising edge of the read control signal.

Figure 6:
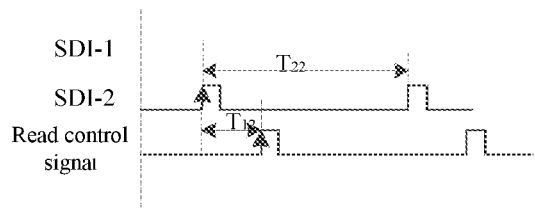
FIG. 6 shows a schematic diagram of a read control signal provided by an embodiment of the disclosure.

The read control signal generating unit 122 may generate the read control signal according to a timing sequence control signal generation diagram shown in FIG. 6. Assuming that the frame period corresponding to the second signal source is the minimum frame period, that is, T22 is the minimum frame period, and the frame period difference corresponding to the minimum frame period is T12, the rising edge of the vertical synchronization pulse of the second signal source is delayed by a time value corresponding to T12 to generate the rising edge of the read control signal, which is provided to the read memory controller.

According to the embodiment of the disclosure, the read control signal is generated by dynamically following the frame period changes of different signal sources, and the problem of frame loss caused by fixedly following the first signal source can be effectively avoided.

Figure 7:
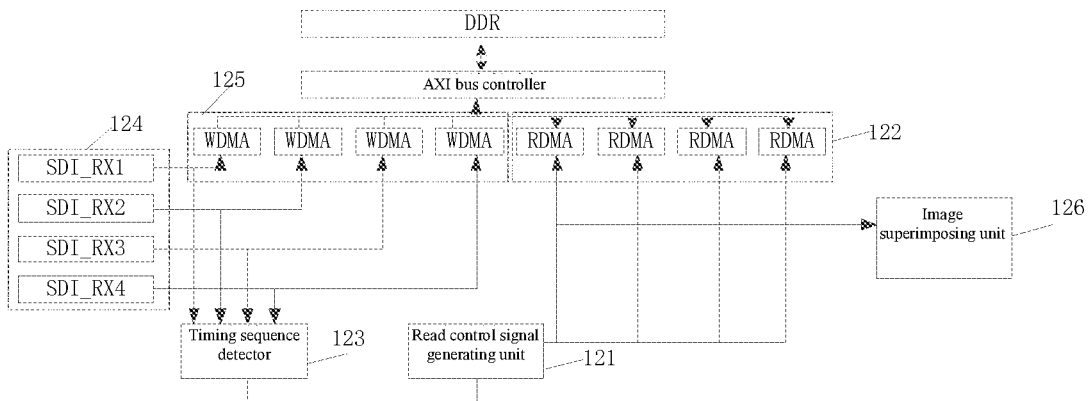
FIG. 7 shows a structural diagram of another read/write control device for a DDR dynamic random access memory provided by an embodiment of the disclosure.

In order to introduce the working principle of this disclosure in detail, the following takes four monitoring signal sources as an example. As shown in FIG. 7 which shows a structural diagram of a read/write control device for a DDR, the read/write control device for the DDR comprises a read signal control generating unit 121 and read memory controllers 122 as shown in FIG. 2. The read memory controller (Read Direct Memory Access, RDMA for short) can be, for example, a frame address read controller, or simply a read controller. The device may further comprise a timing sequence detector 123 as shown in FIG. 4. The functions of the above modules are the same as those described above.

Further, as shown in FIG. 7, the device may further comprise a plurality of receivers 124 corresponding to serial digital interfaces (SDI). The receiver corresponding to the first signal source is SDI_RX1, the receiver corresponding to the second signal source is SDI_RX2, the receiver corresponding to the third signal source is SDI_RX3, and the receiver corresponding to the fourth signal source is SDI_RX4.

The device may also comprise a plurality of write memory controllers 125 in one-to-one correspondence to the receivers. The write memory controller (Write Direct Memory Access, WDMA for short) may be, for example, a frame address write controller, or simply a write controller.

During power-on initialization, an initialization address of the write memory controller 125 is assigned with a value of 3, and an initialization address of the read memory controller 122 is assigned with a value of 1.

The receiver SDI_RX1 corresponding to the first signal source receives monitoring video data from SDI_1 corresponding to the first signal source. The receiver SDI_RX1 corresponding to the first signal source provides a signal to the write memory controller 125, and the write memory controller 125 is configured for controlling the frame address switching of writing.

An address update by the write memory controller 125 can be written into the DDR along with a corresponding clock. For example, a current write frame address corresponding to an n<th> signal source is $WDMA_n(new)$.

The current corresponding write frame address can be calculated by the following formula:

$$WDMA_n(new) = WDMA_n(old) + 1$$

where $WDMA_n(new)$ represents the current write frame address;

$WDMA_n(old)$ a previous write frame address; and n represents the number of signal sources.

When reading the monitoring video frame data initially, one frame of monitoring video frame data can be cached first. Then, in the process of reading the frame address update, the read frame address update is triggered by receiving the read control signal generated by the reading signal control generating unit 121. For example, the read frame address of the previous frame is $RDMA_n(old)$, and when the rising edge of the read control signal is detected, the read frame address update is triggered.

The current corresponding read frame address can be calculated by the following formula:

$$RDMA_n(new) = RDMA_n(old) + 1$$

where $RDMA_n(new)$ represents the current read frame address;

$RDMA_n(old)$ a previous read frame address; and n represents the number of signal sources.

When a new trigger signal, i.e. a new rising edge, arrives, if $RDMA_n(old) = WDMA_n(old)$, the $WDMA_n(old)$ is repeatedly read, i.e. $RDMA_n(new) = RDMA_n(old)$.

In the embodiment of the disclosure, by repeatedly reading the previous read frame address, it is further ensured that there is no frame loss in the frame reading process, thereby effectively improving the accuracy of frame data processing.

The read control signal generating unit determines the minimum frame period by comparing the frame periods of the four signal sources, determines the frame period difference corresponding to the minimum frame period based on the minimum frame period, and then receives the rising edge of the read control signal which can be configured for updating the read frame address based on the minimum frame period and the frame period difference corresponding to the minimum frame period, wherein the duration of the read control signal is the same as that of the vertical synchronization signal. The rising edge of the read control signal may be obtained by delaying the rising edge of the vertical synchronization signal by the frame period difference corresponding to the minimum frame period. The rising edge of the read control signal shown in FIG. 5 is obtained by delaying the rising edge corresponding to the second signal source by the time difference corresponding to T12.

On the basis of the above embodiment, the device may further comprise an image superimposing unit 126, and the image superimposing unit 126 is configured for superimposing the video frames read from the DDR and outputting the superimposed video frames. For example, the image superimposing unit may be a V-by-one transmitting module. V-by-one is a high-definition digital display bus (VOB bus for short), which is configured for communicating with a display device and sending the superimposed video frames to the display device. The display device is, for example, a display.

After the cyclic reading of the frame address update, the image superimposing unit superimposes the read video frames and outputs them to the display, so as to realize the smooth display of a surveillance video.

On the basis of the above embodiment, the device also comprises an AXI bus controller, which can also be called DDR user interface arbitration controller, and is configured for performing interrupt processing on an equipment interrupt request. For example, in order to improve the parallel speed, graphics and videos are interrupted separately, the equipment interrupt request can be resolved into multiple sub-requests, and based on priority judgment, each sub-request corresponds to an interrupt processing logic, so as to improve the real-time display performance of a monitor system.

The division of several modules or units mentioned in the above detailed description is not mandatory. Actually, according to the embodiments of the disclosure, the features and functions of two or more modules or units described above may be embodied in one module or unit. On the contrary, the features and functions of one module or unit described above can be embodied in multiple modules or units.

Figure 8:
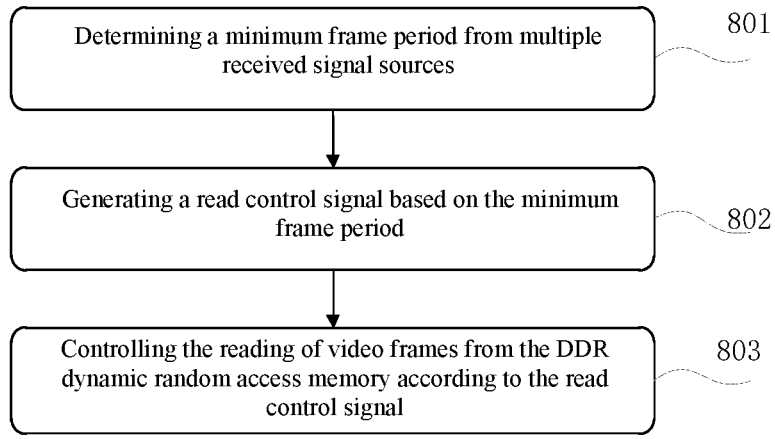
FIG. 8 shows a flowchart of a read/write control method for a DDR dynamic random access memory provided by an embodiment of the disclosure.

On the basis of the above embodiment, an embodiment of the disclosure also provides a read/write control method for a DDR. Please refer to FIG. 8, which shows a flowchart of a read/write control method for a DDR provided by an embodiment of the disclosure. As shown in FIG. 8, the method is applied to the read/write control device for the DDR, and the method comprises:

step 801, determining a minimum frame period from multiple received signal sources;

step 802, generating a read control signal based on the minimum frame period; and step 803, controlling the reading of video frames from the DDR according to the read control signal.

In the above steps, the read/write control device for the DDR dynamically follows and controls the reading of the video frames according to the minimum frame period of the multiple signal sources, which can effectively solve the problem of frame loss caused by fixedly following the first signal source.

Figure 9:
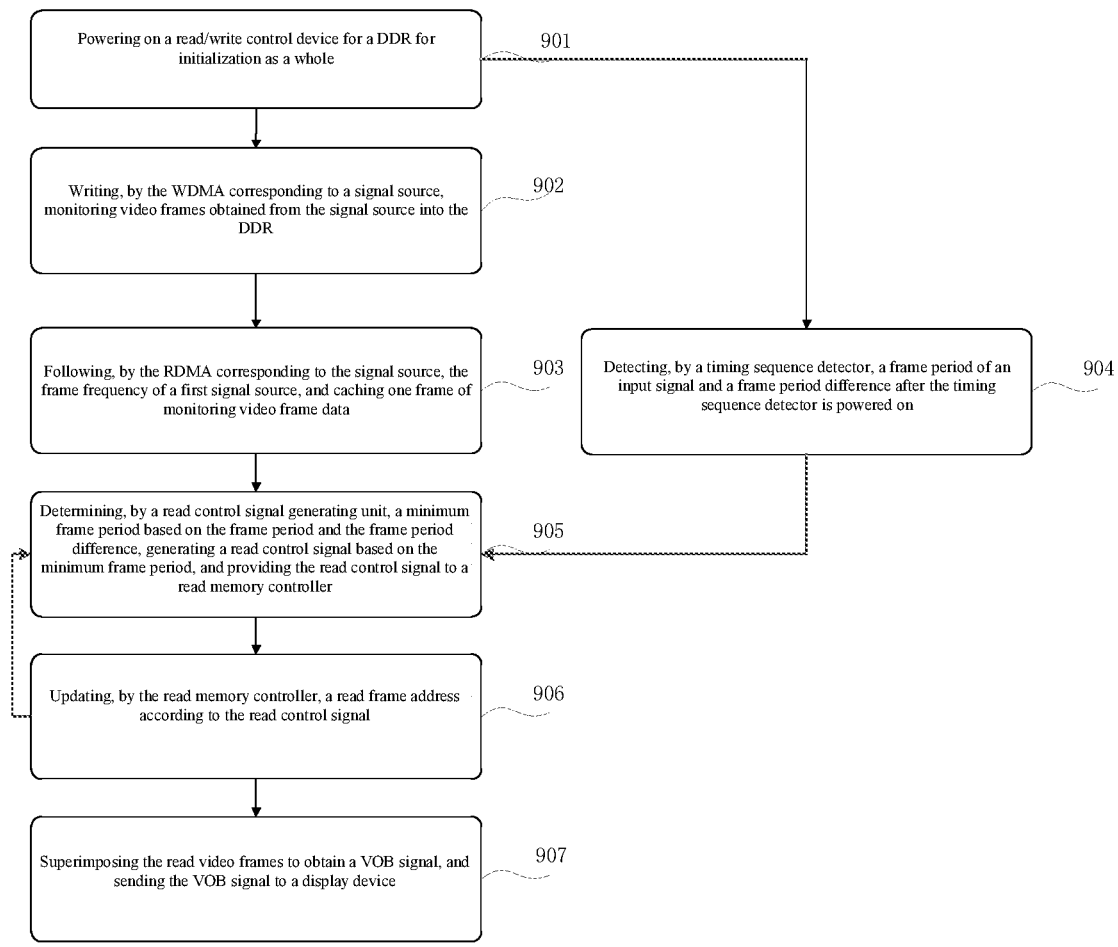
FIG. 9 shows a flowchart of another read/write control method for a DDR dynamic random access memory provided by an embodiment of the disclosure.

On the basis of the above steps of the method, the read/write control for the DDR as described in FIG. 7 is taken as an example, please refer to FIG. 9, which shows a flowchart of a read/write control method for a DDR provided by an embodiment of the disclosure, and as shown in FIG. 9, the method can be executed according to the following steps:

step 901, powering on a read/write control device for a DDR for initialization as a whole;

wherein when a WDMA is powered on, a write frame address of the WDMA is initialized to 3, and when an RDMA is powered on, a read frame address of the RDMA is initialized to 1;

step 902, writing, by the WDMA corresponding to a signal source, monitoring video frames obtained from the signal source into the DDR;

step 903, following, by the RDMA corresponding to the signal source, the frame frequency of a first signal source, and caching one frame of monitoring video frame data;

step 904, detecting, by a timing sequence detector, a frame period of an input signal and a frame period difference after the timing sequence detector is powered on;

step 905, determining, by a read control signal generating unit, a minimum frame period based on the frame period and the frame period difference, generating a read control signal based on the minimum frame period, and providing the read control signal to a read memory controller;

step 906, updating, by the read memory controller, a read frame address according to the read control signal, and repeating steps 905 and 906 to provide the read video frames to an image superimposing unit; and step 907, superimposing the read video frames to obtain a VOB signal, and sending the VOB signal to a display device.

The above step 905 may comprise:

determining a minimum value in the plurality of frame periods as the minimum frame period;

calculating the frame frequency based on the minimum frame period; and generating the read control signal based on the minimum frame period, the frame period difference corresponding to the minimum frame period, and the frame frequency.

The above step 905 further comprises:

determining the frame period difference corresponding to the minimum frame period;

determining a rising edge of each vertical synchronization signal of a signal source corresponding to the minimum frame period; and delaying each rising edge by the frame period difference corresponding to the minimum frame period to obtain a rising edge of the read control signal.

Step 906 may further comprise:

updating the read frame address when the rising edge of the read control signal arrives; and according to the updated read frame address, reading the video frames from the DDR.

When the rising edge of the read control signal arrives and the read frame address is the same as a write frame address of the DDR, a video frame corresponding to the write frame address is repeatedly read.

In the above steps, the read/write control device for the DDR dynamically follows and controls the reading of the video frames according to the minimum frame period of the multiple signal sources, which can effectively solve the problem of frame loss caused by fixedly following the first signal source.

By repeatedly reading the video frame when the write frame address is the same as the read frame address, the probability of frame loss is further reduced, and the accuracy of multi-monitoring video processing is effectively improved.

The above only describes preferred embodiments of the disclosure and applied technical principles. It should be understood by those skilled in the art that the scope of disclosure involved in the disclosure is not limited to technical solutions formed by the specific combination of the above-mentioned technical features, but also covers other technical solutions formed by any combination of the above-mentioned technical features or their equivalent features without departing from the aforementioned disclosed concepts, for example, technical solutions formed by replacing the above features with technical features with similar functions disclosed in the disclosure (but not limited thereto).

The invention claimed is:

1. A read/write control device for a DDR dynamic random access memory, wherein the device comprises a read control signal generating unit and a read memory controller, and the read control signal generating unit is in signal connection with the read memory controller;

the read control signal generating unit is configured for determining a minimum frame period from multiple received signal sources, and further configured for generating a read control signal based on the minimum frame period and providing the read control signal to the read memory controller; and the read memory controller is configured for controlling the reading of video frames from the DDR dynamic random access memory according to the read control signal;

wherein the device comprises a timing sequence detector, the timing sequence detector is in signal connection with the read control signal generating unit, and the timing sequence detector is configured for:

determining a frame period corresponding to each signal source based on a time interval between two adjacent vertical synchronization signals of each signal source in the multiple signal sources;

wherein the timing sequence detector is further configured for:

determining a vertical synchronization signal corresponding to a first signal source in the multiple signal sources;

determining vertical synchronization signals corresponding to other signal sources in the multiple signal sources; and determining a frame period difference based on the vertical synchronization signal corresponding to the first signal source and the vertical synchronization signals corresponding to the other signal sources; and wherein the read control signal generating unit is further configured for:

reading the plurality of frame periods and the plurality of frame period differences determined by the timing sequence detector;

determining a minimum value in the plurality of frame periods as the minimum frame period;

calculating frame frequency based on the minimum frame period; and generating the read control signal based on the minimum frame period, the frame period difference corresponding to the minimum frame period, and the frame frequency.

2. The device according to claim 1, wherein the read control signal generating unit is further configured for:

determining a frame period difference corresponding to the minimum frame period;

determining a rising edge of each vertical synchronization signal of a signal source corresponding to the minimum frame period; and delaying each rising edge by the frame period difference corresponding to the minimum frame period to obtain a rising edge of the read control signal.

3. The device according to claim 1, wherein the read memory controller is further configured for:

updating a read frame address to obtain an updated read frame address under the condition that a rising edge of the read control signal arrives; and according to the updated read frame address, reading the video frames from the DDR dynamic random access memory.

4. The device according to claim 3, wherein the read memory controller is further configured for:

under the condition that the rising edge of the read control signal arrives and the read frame address is the same as a write frame address of the DDR dynamic random access memory, repeatedly reading a video frame corresponding to the write frame address.

5. The device according to claim 1, further comprising an AXI bus controller configured for performing interrupt processing on an equipment interrupt request.

6. A read/write control method for a DDR dynamic random access memory, wherein the method is applied to the read/write control device for the DDR dynamic random access memory according to claim 1, and the method comprises:

determining the minimum frame period from the multiple received signal sources;

generating the read control signal based on the minimum frame period; and controlling the reading of video frames from the DDR dynamic random access memory according to the read control signal;

wherein the method further comprises:

determining the frame period corresponding to each signal source based on the time interval between the two adjacent vertical synchronization signals of each signal source in the multiple signal sources;

wherein the method further comprises:

determining the vertical synchronization signal corresponding to the first signal source in the multiple signal sources;

determining vertical synchronization signals corresponding to the said other signal sources in the multiple signal sources; and determining the frame period difference based on the vertical synchronization signal corresponding to the first signal source and the vertical synchronization signals corresponding to the said other signal sources; and wherein the step of generating the read control signal based on the minimum frame period comprises:

reading the plurality of frame periods and the plurality of frame period differences determined by the timing sequence detector;

determining the minimum value in the plurality of frame periods as the minimum frame period;

calculating frame frequency based on the minimum frame period; and generating the read control signal based on the minimum frame period, the frame period difference corresponding to the minimum frame period, and the frame frequency.

7. The method according to claim 6, wherein the step of generating the read control signal based on the minimum frame period, further comprises:

determining a frame period difference corresponding to the minimum frame period;

determining a rising edge of each vertical synchronization signal of a signal source corresponding to the minimum frame period; and delaying each rising edge by the frame period difference corresponding to the minimum frame period to obtain a rising edge of the read control signal.

8. The method according to claim 6, further comprising:

updating a read frame address to obtain an updated read frame address under the condition that a rising edge of the read control signal arrives; and according to the updated read frame address, reading the video frames from the DDR dynamic random access memory.

9. The method according to claim 8, further comprising:

under the condition that the rising edge of the read control signal arrives and the read frame address is the same as a write frame address of the DDR dynamic random access memory, repeatedly reading a video frame corresponding to the write frame address.

10. The method according to claim 6, further comprising:

powering on the read/write control device for the DDR dynamic random access memory for initialization as a whole, wherein a write frame address of the device is initialized to 3, and when a read memory controller is powered on, a read frame address of the read memory controller is initialized to 1.

11. A monitor system, wherein the system comprises the read/write control device for the DDR dynamic random access memory according to claim 1.

12. The system according to claim 11, wherein the read/write control device for the DDR dynamic random access memory further comprises write memory controllers, and the write memory controllers are configured for controlling the writing of received video frames into the DDR dynamic random access memory.

13. The system according to claim 12, wherein the read/write control device for the DDR dynamic random access memory further comprises an image superimposing unit, and the image superimposing unit is configured for superimposing the video frames read from the DDR dynamic random access memory and outputting the superimposed video frames.

14. The system according to claim 12, wherein the read/write control device for the DDR dynamic random access memory further comprises a plurality of receivers corresponding to digital component serial interfaces, and the plurality of receivers are in one-to-one correspondence to the write memory controllers; and the plurality of receivers is configured for receiving monitoring video data from the corresponding digital component serial interfaces and providing the monitoring video data to the write memory controllers.

* * * * *